(12) United States Patent
Braunstorfinger et al.

(10) Patent No.: US 8,653,825 B2
(45) Date of Patent: Feb. 18, 2014

(54) POWER MEASUREMENT WITH A SIGNAL GENERATOR

(75) Inventors: Thomas Braunstorfinger, Munich (DE); Christian Benisch, Augsburg (DE); Dieter Koehler, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 557 days.

(21) Appl. No.: 12/744,117

(22) PCT Filed: Oct. 16, 2008

(86) PCT No.: PCT/EP2008/008780
§ 371 (c)(1),
(2), (4) Date: May 21, 2010

(87) PCT Pub. No.: WO2009/065473
PCT Pub. Date: May 28, 2009

(65) Prior Publication Data
US 2010/0315093 A1    Dec. 16, 2010

(30) Foreign Application Priority Data

Nov. 22, 2007  (DE) .......................... 10 2007 056 268

(51) Int. Cl.
*G01R 7/00*          (2006.01)
*H01P 1/00*          (2006.01)

(52) U.S. Cl.
USPC ............................ 324/537; 324/142; 333/263

(58) Field of Classification Search
USPC .................... 324/142, 537; 364/708; 333/263
See application file for complete search history.

(56) References Cited

U.S. PATENT DOCUMENTS

| | | | |
|---|---|---|---|
| 4,028,637 A * | 6/1977 | Gewartowski et al. | ... 331/107 R |
| 4,303,881 A * | 12/1981 | Czerwien et al. | ............. 324/142 |
| 4,556,841 A | 12/1985 | Carlson | |
| 4,680,538 A | 7/1987 | Dalman et al. | |
| 5,566,088 A * | 10/1996 | Herscher et al. | .............. 702/123 |
| 5,861,882 A | 1/1999 | Sprenger et al. | |
| 2002/0075013 A1* | 6/2002 | Schell | ............ 324/620 |
| 2006/0103546 A1* | 5/2006 | Salser et al. | ............. 340/870.02 |
| 2007/0052505 A1* | 3/2007 | Simpson | ....................... 333/263 |

FOREIGN PATENT DOCUMENTS

| | | |
|---|---|---|
| DE | 603 04 684 T2 | 9/2006 |
| DE | 10 2005 037 880 A1 | 11/2006 |
| EP | 0 689 306 A2 | 12/1995 |
| EP | 0 776 086 A2 | 5/1997 |
| EP | 0 776 086 B1 | 10/2002 |
| JP | 2005-124128 A | 5/2005 |
| WO | WO 03/071296 A1 | 8/2003 |

OTHER PUBLICATIONS

International Preliminary Report on Patentability, PCT/EP2008/008780, Oct. 7, 2010, pp. 1-13.

(Continued)

*Primary Examiner* — Jermele M Hollington
*Assistant Examiner* — Farhana Hoque
(74) *Attorney, Agent, or Firm* — Ditthavong Mori & Steiner, P.C.

(57) ABSTRACT

A measuring system contains a signal generator and at least one power meter. A device under test is supplied with a signal from the signal generator. A signal output by the device under test can be measured by the first power meter. In this context, the signal generator and the power meter are connected by a bidirectional communications link.

18 Claims, 3 Drawing Sheets

(56) References Cited

OTHER PUBLICATIONS

Chiang et al., "A Simple and Effective Load-Pull System for RF Power Transistor Large-Signal Measurements for Wireless Communication Power Amplifier Design", IEEE Transactions, vol. 46, No. 5, dated Oct. 1, 1997, pp. 1150-1155.

European Search Report, EP 0 689 306 A3, dated Mar. 10, 1999, pp. 1-3.
European Search Report, EP 0 776 086 A3, dated Jan. 20, 1999, pp. 1-2.
International Search Report, PCT/EP2008/008780, dated Feb. 2, 2009, pp. 22-27.

* cited by examiner

POWER MEASUREMENT WITH A SIGNAL GENERATOR

CROSS-REFERENCE TO RELATED APPLICATION

The present application is a national phase application of PCT Application No. PCT/EP2008/008780, filed on Oct. 16, 2008, and claims priority to German Application No. DE 10 2007 056 268.5, filed on Nov. 22, 2007, the entire contents of which are herein incorporated by reference.

BACKGROUND OF THE INVENTION

1. Field of the Invention

The invention relates to a measuring device and a measuring method with a signal generator, which is connected to a power meter especially for the implementation of high-frequency measurements.

2. Discussion of the Background

For the measurement of devices under test (DUT), for example, with network analyzers, a signal is conventionally generated by a signal generator, supplied to the device under test and a resulting signal is registered by a measuring device. From the measured signal, the measuring device determines various characteristics of the device under test. However, the disadvantage with this procedure is that the measuring device requires large independent processing capacities in order to determine and present the characteristics. Furthermore, an efficient control of the measurement is not possible without additional devices, such as a sequential control unit. Without such control, the measurement lasts a considerable time and may be inaccurate.

EP 0 776 086 B1 discloses a signal generator with built-on measuring instruments for determining the characteristics of various devices under test. Accordingly, an independent connection of the signal generator to the measuring devices used is not present. The difficulties described above occur.

SUMMARY OF THE INVENTION

Embodiments of the invention advantageously provide a measuring device and a measuring method, which can implement power measurements with a short measuring time and high precision thereby incurring low economic costs.

A measuring system contains a signal generator and at least one power meter. A device under test can be supplied with a signal from the signal generator. A signal output from the device under test can be measured by the first power meter. Accordingly, the signal generator and the power meter are connected by means of a bidirectional communications link. In this manner, a mutual agreement between the power meter and the signal generator is achieved. The accuracy of measurement is increased as a result. The measurement time is reduced as a result.

The bidirectional communications link is preferably implemented via a bus or a bus and a bus-adapter. This guarantees a standardized communication. By means of a bus-adapter, devices with different connections and communications methods can be connected to one another.

The signal generator is preferably connected to the power meter or the bus-adapter via an additional trigger line. Accordingly, a more accurate triggering and therefore a further increase in measurement accuracy can be achieved. A further reduction in measurement time can also be achieved.

Parameters of the signal, which are supplied to the device under test, can advantageously be transmitted from the signal generator to the power meter via the bidirectional communications link. Accordingly, the power meter can be adjusted optimally to the current test signal. A further increase in measurement accuracy is achieved in this manner.

Measured values and/or status information can preferably be transmitted via the bidirectional communications link from the power meter to the signal generator. The status information preferably displays the completion of a partial measurement and/or of an entire measurement. Accordingly, a further processing of the measured values by those devices is possible. Moreover, the measurement time is further reduced by communicating the completion of the measurement.

The device under test is preferably connected by means of a circulator to the signal generator. The first power meter is preferably connected via the circulator to the device under test. By preference, the signal reflected from the device under test is measurable by the power meter. Accordingly, signals reflected from the device under test can be measured. The recording of a reflection characteristic is possible.

The signal generator preferably contains a display device and a processing device. The results of the measurement of the power meter can advantageously be transmitted to the signal generator. The results of the measurement of the power meter can preferably be processed by the processing device and can preferably be displayed by the display device. Accordingly, the measured results can be displayed in a clear and comprehensible manner. A use of cost-favorable power meters, which do not provide an internal processing device and an internal display device, is also possible.

The course of a measurement can advantageously be controlled jointly by the signal generator and the power meter. The measurement time is optimized through a mutual process of this kind. Furthermore, measurement errors resulting from a difference in status of the devices are avoided.

The first power meter is preferably a frequency-selective power meter. Accordingly, the measurement accuracy can be further increased. This also reduces the requirement for the steepness of the output filter of the signal generator. Frequency-variable behavior of the device under test can be determined in this manner.

An AM-AM characteristic can advantageously be determined with the measuring system. Accordingly, scalar characteristics can be determined with a simple measurement set-up.

Several power meters are preferably connected to the signal generator by means of bidirectional communications links. Several signals output by the device under test can preferably be measured by the several power meters. Accordingly, a shortening of the measurement time can be achieved with the simultaneous measurement through parallelization. Furthermore, a synchronous measurement is possible in the case of non-periodic signals.

BRIEF DESCRIPTION OF THE DRAWINGS

The invention is described by way of example below on the basis of the drawings, in which an advantageous exemplary embodiment of the invention is presented. The drawings are as follows.

DETAILED DESCRIPTION OF EXEMPLARY EMBODIMENTS OF THE INVENTION

The structure and functioning of various exemplary embodiments of the measuring system according to the invention and the method according to the invention are illustrated with reference to FIGS. 1-3.

Figure 1:
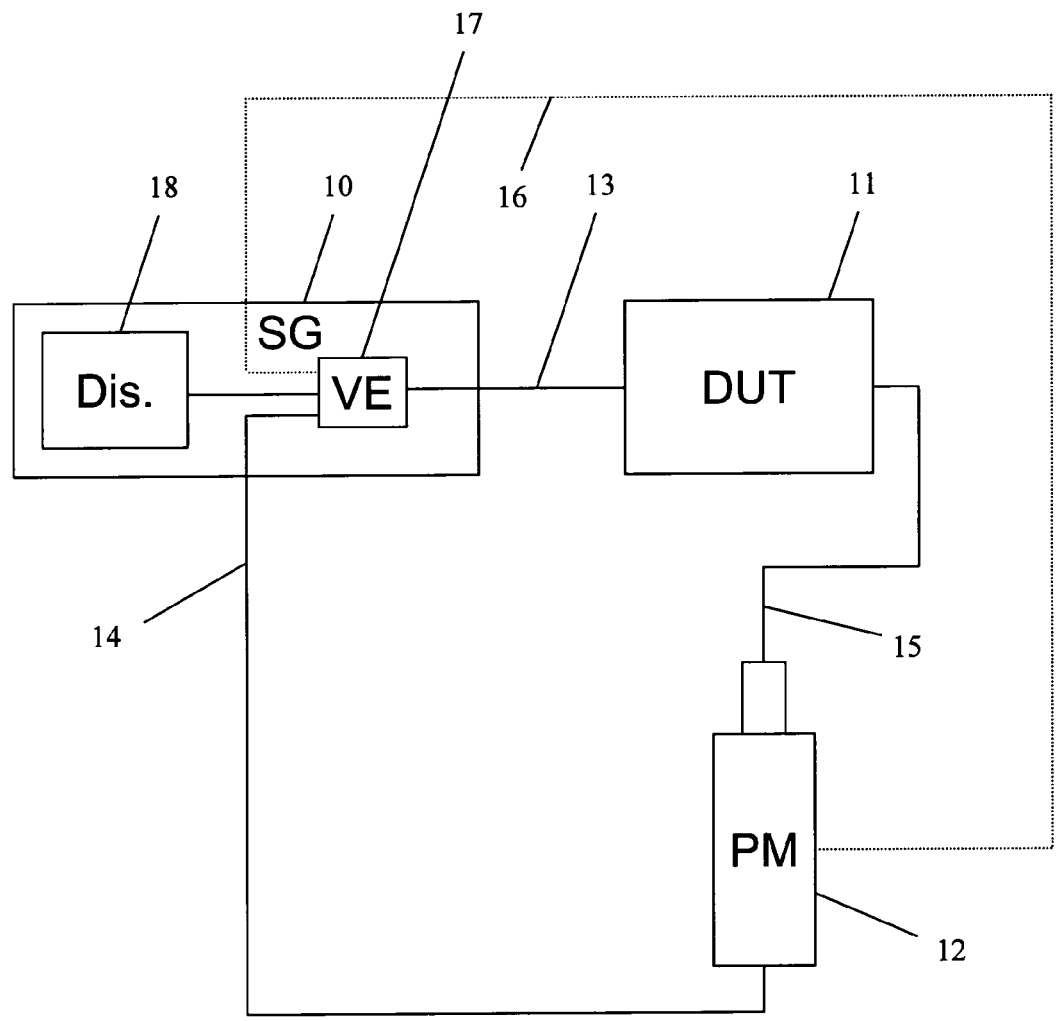
FIG. 1 shows a first exemplary embodiment of the measuring system according to the invention.

FIG. 1 shows a first exemplary embodiment of the measuring system according to the invention. A signal generator 10 is connected by means of a high-frequency transmission line 13 to a device under test 11. The device under test 11 is connected by means of a further high-frequency transmission line 15 to a power meter 12. The power meter 12 is connected by means of a digital bus 14 to the signal generator 10. The bus is preferably a USB bus. Furthermore, the signal generator 10 is connected to the power meter 12 by means of an optional trigger line 16.

The signal generator 10 transmits an input signal to the device under test 11 via the first high-frequency transmission line 13. The device under test 11 is excited by the input signal to output an output signal. This output signal is transmitted via the high-frequency transmission line 15 to the power meter 12. The power meter 12 measures the power of the signal and transmits the result to the signal generator 10 via the digital bus 14.

In this context, the signal generator 10 communicates the current measuring point in amplitude and frequency, via the digital bus 14 in the preferred exemplary embodiment, to the power meter 12. This allows the power meter 12 to adjust internal filters dependent upon selected frequency and/or to adjust internal measurement branches dependent upon anticipated amplitude. The beginning of the measurement of the current measuring point is signalled either via the digital bus 14 or via the trigger line 16. After the completion of the measurement of the current measuring point, the power meter 12 communicates the end of the measurement to the signal generator 10, thereby allowing the signal generator 10 to continue with the next measuring point. The measured values communicated to the signal generator 10 are rerouted by the latter in a processing device 17 and displayed on a display device 18. The processing device 17 is also responsible for generating the trigger signal and the input signal.

Figure 2:
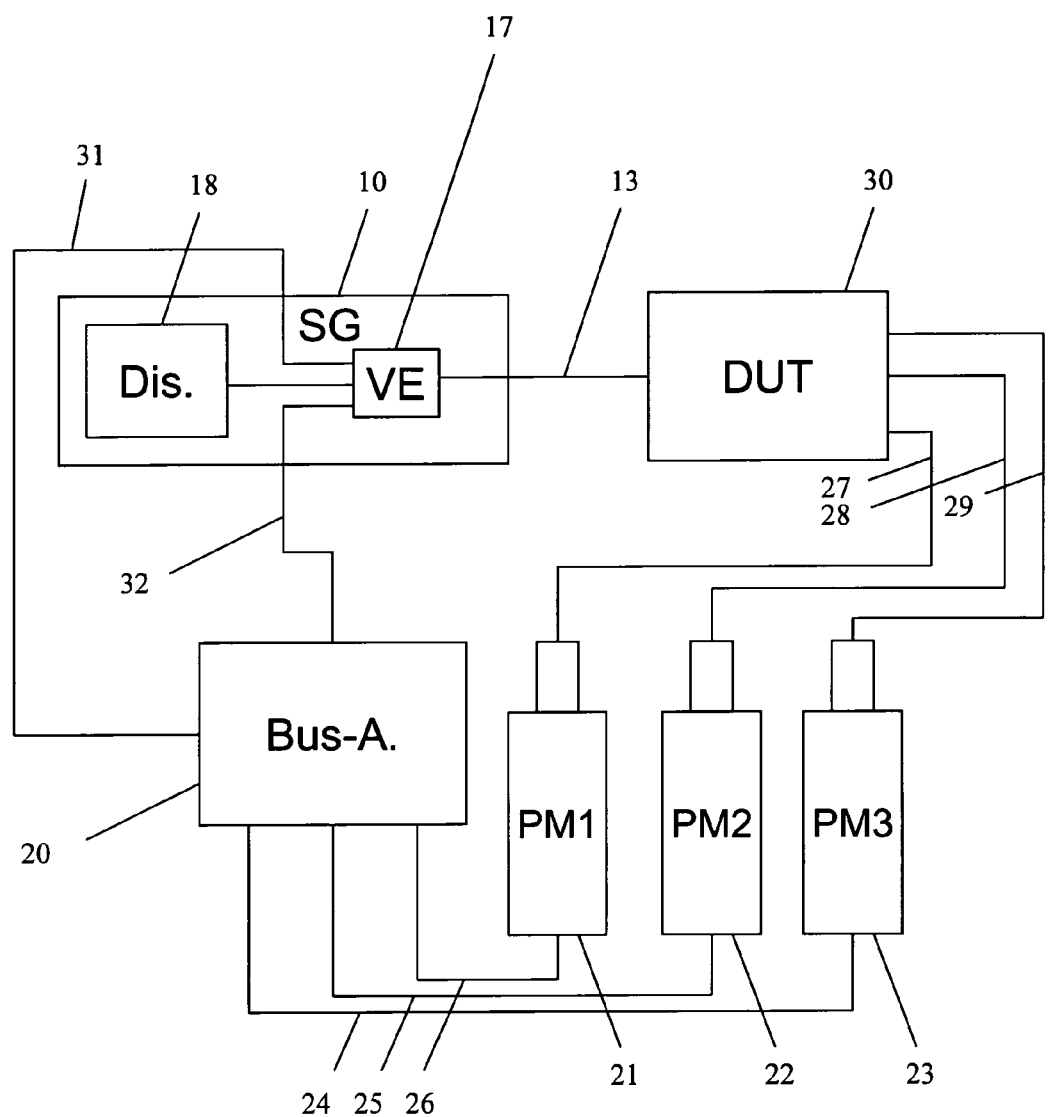
FIG. 2 shows a second exemplary embodiment of the measuring system according to the invention.

FIG. 2 shows a second exemplary embodiment of the measuring system according to the invention. A signal generator 10 is connected by means of a high-frequency transmission line 13 to a device under test 30. the device under test 30 provides several measuring points, to which different output signals are connected. Via the high-frequency transmission lines 27, 28 and 29, the device under test is connected to the power meters 21, 22 and 23. These are connected by means of the digital bus 24, 25 and 26 to a bus-adapter 20. The bus-adapter 20 is connected to the signal generator 10 by means of the digital bus 32. This is also preferably a USB bus. Moreover, the bus-adapter 20 is also connected to the signal generator 10 via a trigger line 31. The signal generator 10 transmits an input signal via the high-frequency transmission line 13 to the device under test 30. A transmission of several different input signals via several high-frequency transmission lines is also conceivable.

The device under test 30 is excited by the input signal to output several output signals. The several output signals are transmitted by high-frequency transmission lines 27, 28 and 29 to the power meters 21, 22 and 23. The power meters 21, 22 and 23 measure the power of the signals and transmit the latter respectively via the allocated digital bus 24, 25 and 26 to the bus-adapter 20, which transmits the measured values via the digital bus 32 to the signal generator 10. Via the trigger line 31, the signal generator 10 indicates to the bus-adapter 20, and therefore also to the power meters 21, 22 and 23, the beginning of a measurement or respectively of a partial measurement.

Furthermore, via the digital bus 32, the signal generator 10 transmits the position of the current measuring point in frequency and amplitude to the bus-adapter 20 and further, via the digital bus 24, 25 and 26, to the power meters 21, 22 and 23. After the completion of the measurement of the current measuring point, this circumstance is communicated via the digital bus 24, 25 and 26, the bus-adapter 20 and the digital bus 32, to the signal generator 10. The latter can now continue with the next measuring point. The measured values communicated to the signal generator 10 are further processed by the latter in a processing device 17 and displayed on a display device 18. The processing device 17 is also responsible for generating the trigger signals and the input signal.

Figure 3:
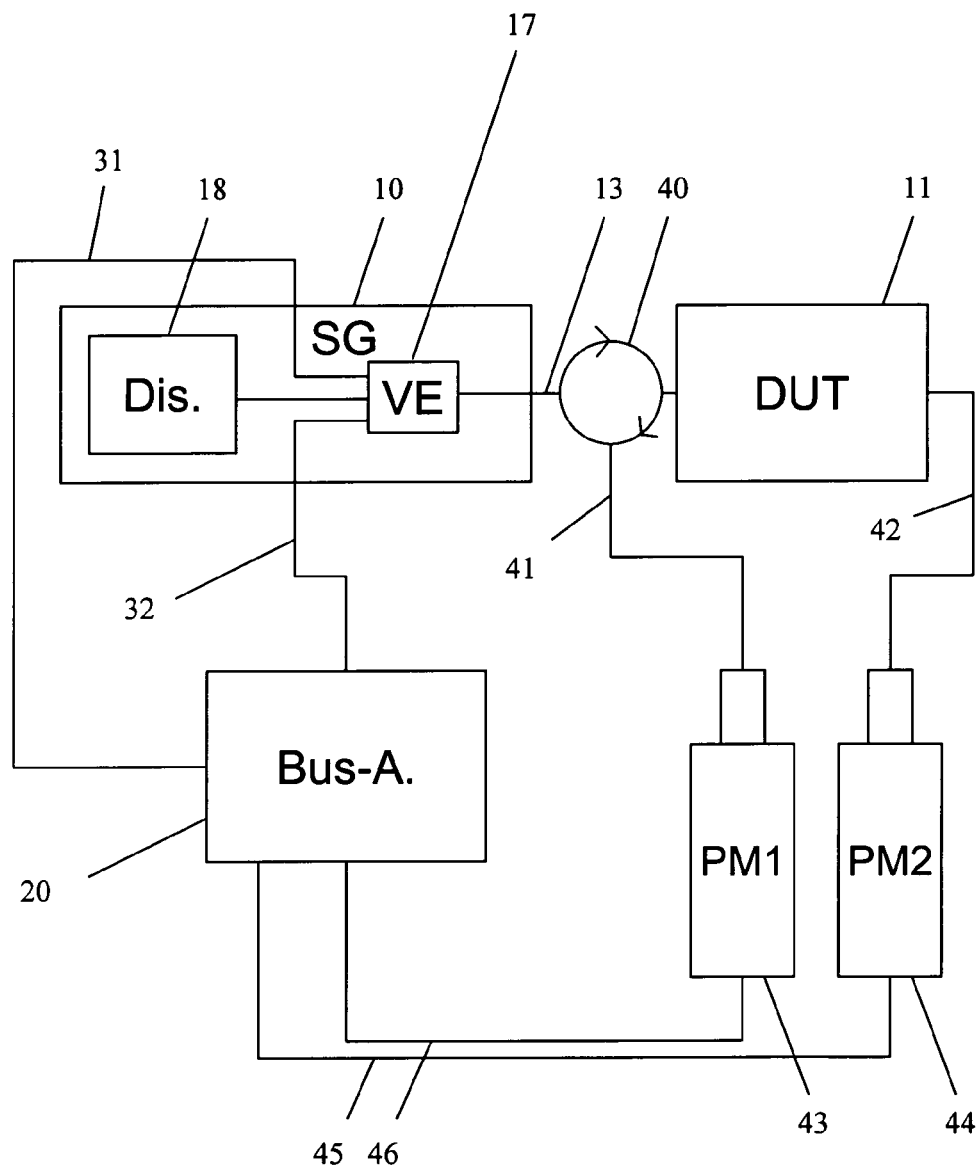
FIG. 3 shows a third exemplary embodiment of the measuring system according to the invention.

FIG. 3 shows a third exemplary embodiment of the device according to the invention. A signal generator 10 is connected by means of a high-frequency transmission line 13 to a circulator 40. The circulator 40 is connected to a device under test. Furthermore, the circulator 40 is connected via a high-frequency transmission line 41 to a first power meter 43. The device under test 11 is connected by means of a high-frequency transmission line 42 to a second power meter 44. The power meters 43 and 44 are connected in each case by means of a digital bus 45 and 46, for example, a USB bus, to the bus-adapter 20. The bus-adapter 20 is connected by means of the digital bus 32, for example, a USB bus, to the signal generator 10. Furthermore, the bus-adapter 20 is also connected by means of a trigger line 31 to the signal generator 10.

The signal generator 10 supplies the device under test 11 via the high-frequency transmission line 13 and the circulator 40 with an input signal. Accordingly, the device under test 11 is excited to output an output signal. This output signal is measured by the power meter 44. Moreover, the device under test 11 reflects a part of the input signal. This reflected signal is transmitted from the circulator 40 and the high-frequency transmission line 41 to the power meter 43 and measured by the latter. The values measured by the power meters 43, 44 are transmitted via the digital bus 45, 46 to the bus-adapter 20. The bus-adapter 20 transmits the measured values via the digital bus 32 to the signal generator 10.

Via the trigger line 31, the bus-adapter 20 and the digital bus 45, 46, the signal generator 10 signals the beginning of the measurements or respectively of the partial measurements to the power meters 43, 44. The position of the current measuring point in frequency and amplitude is transmitted to the power meters 43, 44 via the digital bus, the bus-adapter 20 and the digital bus 45, 46. In return motion, alongside the measured values, the power meters 43, 44 transmit the timing point for completion of the measurement of the current measuring point. Accordingly, the signal generator 10 can continue with the next measuring point. The measured values communicated to the signal generator 10 are further processed by the latter in a processing device 17 and displayed on a display device 18. The processing device 17 is also responsible for generating the trigger signal and the input signal.

The invention is not restricted to the exemplary embodiment presented. As already mentioned, different power meters can be connected to the signal generator. Similarly, a measurement of different characteristics and individual values is possible. A measurement of the output signal of the signal generator for calibration with a simple through-con-

The invention claimed is:

1. A measuring system, comprising:
a signal generator,
a plurality of power meters,
a device under test receiving a signal from the signal generator, and generating an output signal in response thereto,
wherein the output signal is supplied to each of the plurality of power meters for measurement by the device under test can be measured by the power meters,
wherein the signal generator and the plurality of power meters are connected by a bidirectional communications link,
wherein the signal generator contains a processing device for processing the output of each of the plurality of power meters, and a display device, and
wherein the plurality of power meters contains no processing device, and
a trigger line connecting the signal generator to each of the plurality of power meters for signaling to each of the plurality of power meters the beginning of a measurement cycle, the trigger line being separate and distinct from any other connection.

2. The measuring system according to claim 1, wherein the bidirectional communications link is implemented via a bus or a bus and a bus-adapter.

3. The measuring system according to claim 1, wherein parameters of the signal received by the device under test, are transmitted from the signal generator to each of the plurality of power meters.

4. The measuring system according to claim 1, wherein measured values and/or status information are transmitted from each of the plurality of power meters to the signal generator via the bidirectional communications link, and
the status information displays the completion of a partial measurement and/or of an entire measurement.

5. The measuring system according to claim 1, wherein the device under test is connected by a circulator to the signal generator,
each of the plurality of power meters is connected via the circulator to the device under test, and
the output signal generated from the device under test is measured by the plurality of power meters.

6. The measuring system according to claim 1, wherein results of the measurement by the plurality of power meters are transmitted to the signal generator, and
the results of the measurement by the power meters are displayed by the display device.

7. The measuring system according to claim 1, wherein the course of a measurement is controlled jointly by the signal generator and the plurality of power meters.

8. The measuring system according to claim 1, wherein the plurality of power meters comprises frequency-selective power meters.

9. The measuring system according to claim 1, wherein an AM-AM characteristic is determined with the measuring system.

10. A method, comprising:
supplying a device under test with a signal from a signal generator,
measuring a signal output from the device under test by transmitting the signal to a plurality of power meters,
connecting the signal generator and the plurality of power meters by a bidirectional communications link,
processing an output of each of the power meters with a processing device within the signal generator, the signal generator also containing a display device,
wherein the plurality of power meters contains no processing device, and
triggering each of the plurality of power meters via a trigger line connecting the signal generator to each of the plurality of power meters, wherein the triggering signals the beginning of a measurement cycle and the trigger line is separate and distinct from any other connection.

11. The measuring method according to claim 10, wherein the bidirectional communications link is implemented via a bus or a bus and a bus-adapter.

12. The method according to claim 10, wherein
the signal generator transmits parameters of the signal received by the device under test, via the bidirectional communications link to each of the plurality of power meters.

13. The method according to claim 10, wherein
each of the plurality of power meters transmits measured values and/or status information to the signal generator via the bidirectional communications link, and
the status information displays the completion of a partial measurement and/or of an entire measurement.

14. The method according to claim 10, wherein
the device under test is connected by a circulator to the signal generator,
each of the plurality of power meters is connected to the device under test via the circulator,
the output signal generated from the device under test is transmitted by the circulator to the plurality of power meters, and
each of the plurality of power meters measures the output signal generated from the device under test.

15. The method according to claim 10, wherein
results of the measurement by the plurality of power meters are transmitted to the signal generator, and
the results of the measurement by the plurality of power meters are displayed by the display device.

16. The method according to claim 10, wherein
the course of a measurement is controlled jointly by the signal generator and the plurality of power meters.

17. The method according to claim 10, wherein
the plurality of power meters comprises frequency-selective power meters.

18. The method according to claim 10, wherein
an AM-AM characteristic is determined with the measuring method.

* * * * *